(12) United States Patent
Kim

(10) Patent No.: US 9,673,410 B2
(45) Date of Patent: Jun. 6, 2017

(54) DEPOSITION APPARATUS, METHOD THEREOF AND METHOD FOR FORMING QUANTUM-DOT LAYER USING THE SAME

(71) Applicant: SAMSUNG DISPLAY CO., LTD., Yongin-si, Gyeonggi-Do (KR)

(72) Inventor: Dong-Chan Kim, Gunpo-si (KR)

(73) Assignee: SAMSUNG DISPLAY CO., LTD., Yongin, Gyeongg-Do (KR)

( * ) Notice: Subject to any disclaimer, the term of this patent is extended or adjusted under 35 U.S.C. 154(b) by 0 days.

(21) Appl. No.: 15/040,180

(22) Filed: Feb. 10, 2016

(65) Prior Publication Data

US 2016/0172613 A1  Jun. 16, 2016

Related U.S. Application Data

(62) Division of application No. 14/040,870, filed on Sep. 30, 2013, now Pat. No. 9,293,645.

(30) Foreign Application Priority Data

May 22, 2013 (KR) ........................ 10-2013-0057625

(51) Int. Cl.
*H01L 51/56* (2006.01)
*H01L 51/50* (2006.01)
(Continued)

(52) U.S. Cl.
CPC .......... *H01L 51/502* (2013.01); *C23C 14/024* (2013.01); *C23C 14/56* (2013.01);
(Continued)

(58) Field of Classification Search
CPC ....... H01L 51/56; H01L 33/06; H01L 51/502; H01L 51/0008; H01L 51/5072;
(Continued)

(56) References Cited

U.S. PATENT DOCUMENTS 7,326,908 B2 * 2/2008 Sargent ................. B82Y 10/00 250/214.1
7,777,233 B2 * 8/2010 Kahen .................. C09K 11/025 257/21

(Continued)

FOREIGN PATENT DOCUMENTS

KR   1020060012120   7/2006
KR   1020090034986   8/2009
(Continued)

*Primary Examiner* — Bac Au
(74) *Attorney, Agent, or Firm* — F. Chau & Associates, LLC

(57) ABSTRACT

A deposition apparatus includes a first nozzle configured to spray a first deposition material toward a substrate and a second nozzle configured to spray a second deposition material, a first deposition source configured to supply the first deposition material to the first nozzle and a second deposition source configured to supply the second deposition material to the second nozzle. The deposition apparatus further includes a barrier member disposed between the first nozzle and the second nozzle and is configured to block the first deposition material evaporated through the first nozzle from being mixed with the second deposition material evaporated through the second nozzle and a vacuum chamber configured to surround the first and second nozzles, the first and second deposition sources and the barrier member.

11 Claims, 7 Drawing Sheets

(51) Int. Cl.
*H01L 33/06* (2010.01)
*C23C 14/56* (2006.01)
*C23C 14/02* (2006.01)
*H01L 51/00* (2006.01)
*H01L 51/52* (2006.01)

(52) U.S. Cl.
CPC ............ *C23C 14/568* (2013.01); *H01L 33/06* (2013.01); *H01L 51/0008* (2013.01); *H01L 51/5072* (2013.01); *H01L 51/5088* (2013.01); *H01L 51/5278* (2013.01); *H01L 51/56* (2013.01)

(58) Field of Classification Search
CPC ........... H01L 51/5088; H01L 51/55278; C23C 14/24; C23C 14/024; C23C 14/56; C23C 16/568
See application file for complete search history.

(56) References Cited

U.S. PATENT DOCUMENTS

| | | | |
|---|---|---|---|
| 7,880,377 B2* | 2/2011 | Orita | B82Y 20/00 313/503 |
| 7,919,342 B2* | 4/2011 | Cok | H05B 33/145 257/79 |
| 7,952,105 B2* | 5/2011 | Cok | H05B 33/28 257/13 |
| 8,101,941 B2* | 1/2012 | Choulis | B82Y 20/00 257/40 |
| 9,096,425 B2* | 8/2015 | Coe-Sullivan | B81C 1/0038 |
| 2005/0241585 A1 | 11/2005 | Cok | |
| 2009/0321722 A1 | 12/2009 | Buechel | |
| 2010/0237322 A1* | 9/2010 | Okada | H01L 51/5012 257/13 |
| 2010/0297349 A1 | 11/2010 | Lee et al. | |
| 2011/0140075 A1* | 6/2011 | Zhou | B82Y 20/00 257/13 |
| 2011/0165327 A1 | 7/2011 | Park et al. | |
| 2012/0174865 A1 | 7/2012 | Choi et al. | |
| 2012/0274231 A1* | 11/2012 | Tu | H01L 51/502 315/291 |
| 2013/0008379 A1 | 1/2013 | Change et al. | |
| 2014/0349430 A1 | 11/2014 | Kim | |
| 2015/0076469 A1* | 3/2015 | Ikemizu | C09K 11/88 257/40 |

FOREIGN PATENT DOCUMENTS

| | | |
|---|---|---|
| KR | 1020120016342 | 2/2012 |
| KR | 1020120081811 | 7/2012 |

* cited by examiner

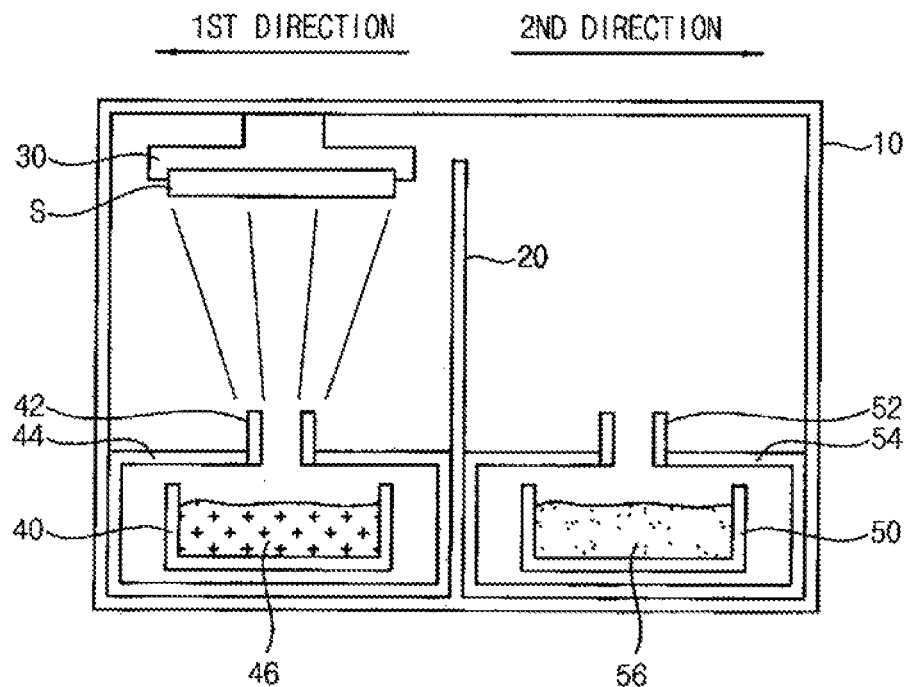
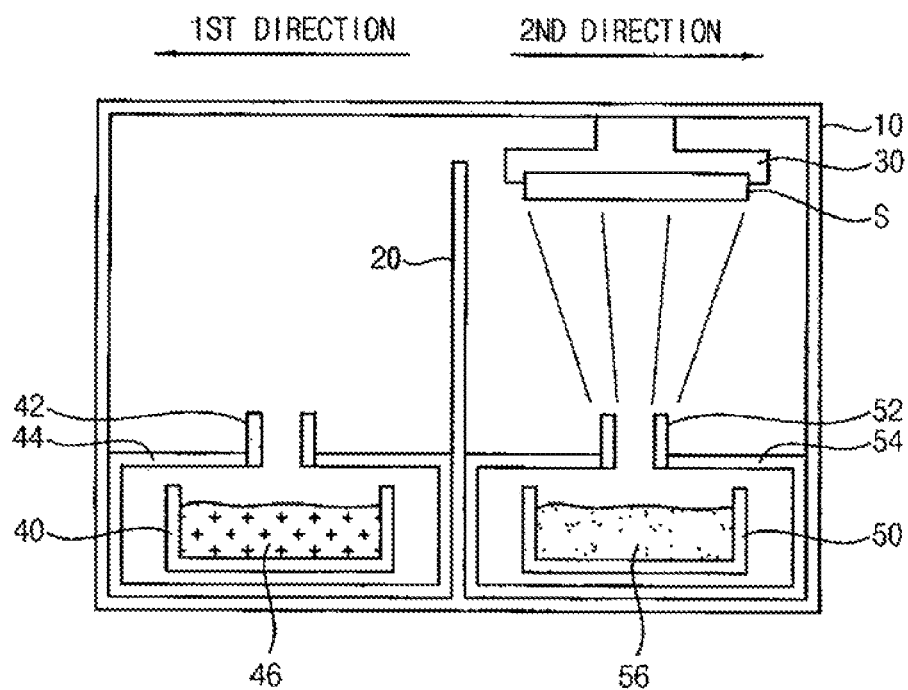

DEPOSITION APPARATUS, METHOD THEREOF AND METHOD FOR FORMING QUANTUM-DOT LAYER USING THE SAME

CROSS-REFERENCE TO RELATED APPLICATION(S)

This application is a Division of co-pending U.S. patent application Ser. No. 14/040,870, filed Sep. 30, 2013, which claims priority under 35 USC §119 to Korean Patent Application No. 10-2013-0057625, filed on May 22, 2013, the disclosure of which is hereby incorporated by reference herein in its entirety.

TECHNICAL FIELD

The present disclosure relates to a deposition apparatus, a method thereof and a method for forming a quantum-dot layer using the same. More particularly, the present disclosure relates to a deposition apparatus for depositing at least two kinds of materials, a method thereof and a method for forming a quantum-dot layer using the same.

DISCUSSION OF THE RELATED ART

A quantum dot light emitting element uses a quantum dot to form a light emitting layer. The quantum dot light emitting element controls the size of the quantum dot and it can present desired natural colors. In addition, the quantum dot light emitting element may have good color presentation and good brightness, compared with a light emitting diode (LED). As a result, the quantum dot light emitting element is drawing attention to overcome the difficulties of the light emitting diode spotlighted as the next generation light source.

The quantum dot is a semiconductor material having a crystallization structure having a size smaller than an exciton bohr radius, that is, a size of, for example, several nanometers. Although the quantum dot has many electrons, the number of free electrons may be limited to a range of from, for example, about one to about one hundred. In this case, an electrons' energy level may be discontinuously limited, and thus the quantum dot may show electrical and optical characteristics different from those of a semiconductor in a bulk state which forms a continuous band. In the quantum dot, the energy level varies according to the size of the quantum dot, and thus the bandgap may be controlled by changing the quantum dot's size. That is, the quantum dot may control the emission wavelength only by changing its size.

For example, to form the quantum dot, an ink jet printing, a spin coating, a nozzle coating, a spray coating and a slit coating methods may be used.

However, by using printing methods or coating methods, it may be difficult to form a high purity layer and the cost for manufacturing extra equipment may be increased. To overcome these difficulties, methods for forming a high purity layer and for using existing equipment may be needed.

SUMMARY

Example embodiments provide a deposition apparatus capable of depositing at least two kinds of materials by using a method of thermal evaporation.

Example embodiments also provide a method for deposition capable of depositing at least two kinds of materials by using a method of thermal evaporation.

Example embodiments also provide a method for forming a quantum dot layer capable of forming a quantum dot layer by using a method of thermal evaporation.

According to example embodiments, a deposition apparatus includes a first nozzle, a second nozzle, a first deposition source, a second deposition source, a barrier member and a vacuum chamber. The first nozzle is configured to spray a first deposition material toward a substrate. The second nozzle is configured to spray a second deposition material. The first deposition source is configured to supply the first deposition material to the first nozzle. The second deposition source is configured to supply the second deposition material to the second nozzle. The barrier member is disposed between the first nozzle and the second nozzle and is configured to block the first deposition material evaporated through the first nozzle from being mixed with the second deposition material evaporated through the second nozzle. The vacuum chamber is configured to surround the first and second nozzles, the first and second deposition sources and the barrier member.

In example embodiments, the deposition apparatus may further include a transporting device configured to transport the substrate in a first direction above the first nozzle or in a second direction above the second nozzle.

In example embodiments, the substrate may be transported in a first direction and the first deposition material is deposited on the substrate which is above the first nozzle and the substrate may be transported in a second direction and the second deposition material is deposited on the substrate which is above the second nozzle.

In example embodiments, the number of each of the first nozzle and the second nozzle may be one or a plurality.

In example embodiments, each of the first deposition material and the second deposition material may include a linear source.

In example embodiments, each of the first deposition material and the second deposition material may include a point source.

In example embodiments, the first deposition material and the second deposition material may be deposited using a method of thermal evaporation.

In example embodiments, the vacuum chamber may include a first heating device configured to heat the first deposition source and a second heating device configured to heat the second deposition source.

According to example embodiments, a method for deposition using a deposition apparatus is provided as follows. A first deposition material is supplied to a first deposition source and a second deposition material which is different from the first deposition material is supplied to a second deposition source. A substrate is disposed opposite a first nozzle coupled to the first deposition source and a second nozzle coupled to the second deposition source. The substrate is transported in a first direction in which the first nozzle is disposed to place the substrate above the first nozzle. The first deposition material is deposited on the substrate through the first nozzle, and the first deposition material is stored in the first deposition source. The substrate is transported in a second direction in which the second nozzle is disposed to place the substrate above the second nozzle. The second deposition material is deposited on the substrate through the second nozzle, and the second deposition material is stored in the second deposition source.

In example embodiments, the depositing of the first deposition material and the depositing of the second deposition material may be performed in a vacuum chamber.

In example embodiments, the number of each of the first nozzle and the second nozzle may be one or a plurality.

In example embodiments, each of the first deposition material and the second deposition material may include a linear source.

In example embodiments, each of the first deposition material and the second deposition material may include a point source.

In example embodiments, the first deposition material and the second deposition material may be deposited using a method of thermal evaporation.

According to an embodiment, a method for forming a quantum dot layer using a deposition apparatus is provided. The method includes depositing a first deposition material on a substrate, depositing a second deposition material on the deposited first deposition material at a thinner thickness than a thickness of the deposited first deposition material, depositing the first deposition material on the second deposition material at a same thickness as thickness of the deposited first deposition material to isolate the second deposition material from outside and agglomerating the second deposition material which is disposed between the two deposited first deposition materials to form a quantum dot layer.

In example embodiments, a first electrode and the hole injection layer may be sequentially stacked on the substrate.

In example embodiments, a second electrode and the electron transport layer may be sequentially stacked on the substrate.

In example embodiments, the first deposition material may include organic material and the second deposition material include inorganic material.

In example embodiments, the second deposition material may be deposited between first deposition materials and a thickness of the deposited second deposition material may be thinner than the thickness of the deposited first deposition material.

In example embodiments, the first deposition material and the second deposition material may be deposited using a method of thermal evaporation.

In example embodiments, a quantum dot size of the quantum dot layer may depend on a difference of a surface energy between the first deposition material and the second deposition material, and the quantum dot size of the quantum dot layer also may depend on the thickness of the second deposition material.

In example embodiments, the quantum dot layer may comprise a plurality of quantum dots each having a size configured to emit light of a same wavelength band as each other.

In example embodiments, the quantum dot layer may have a multi-layered structure in which the quantum dot layers are vertically stacked.

In accordance with an example embodiment, a method for forming a display device is provided. The method includes forming a first electrode on a first substrate, forming a hole injection layer on the first electrode, forming a light emitting layer having a multi-layer quantum dot structure including a plurality of quantum dots disposed between organic materials on the hole injection layer.

The forming of the light emitting layer includes depositing a first deposition material on the hole injection layer to form a first organic layer on the hole injection layer by thermal evaporation, depositing a second deposition material on the first organic layer to form an inorganic layer on the first organic layer having a thinner thickness than a thickness of the first organic layer by thermal evaporation, depositing the first deposition material on the inorganic layer to form a second organic layer on the inorganic layer having a same thickness as the thickness of the first organic layer by thermal evaporation, and agglomerating materials of the inorganic layer which is disposed between the first and second organic layers to form a quantum dot layer between the first and second organic layers.

In addition, the method for forming the display device further includes providing a stacked structure including an electron transport layer, a second electrode and a second substrate sequentially stacked on the light emitting layer.

According to the present invention, a deposition apparatus, a method thereof and a method for forming quantum dot layer using the same may deposit at least two kinds of materials in the same chamber. Also, high purity quantum dot layers may be formed inexpensively by using existing facilities.

BRIEF DESCRIPTION OF THE DRAWINGS

Illustrative, non-limiting example embodiments can be more clearly understood from the following detailed description taken in conjunction with the accompanying drawings.

FIGS. 5A and 5B are cross-sectional views illustrating a method for deposition of FIG. 4.

DETAILED DESCRIPTION OF EXAMPLE EMBODIMENTS

Figure 1:
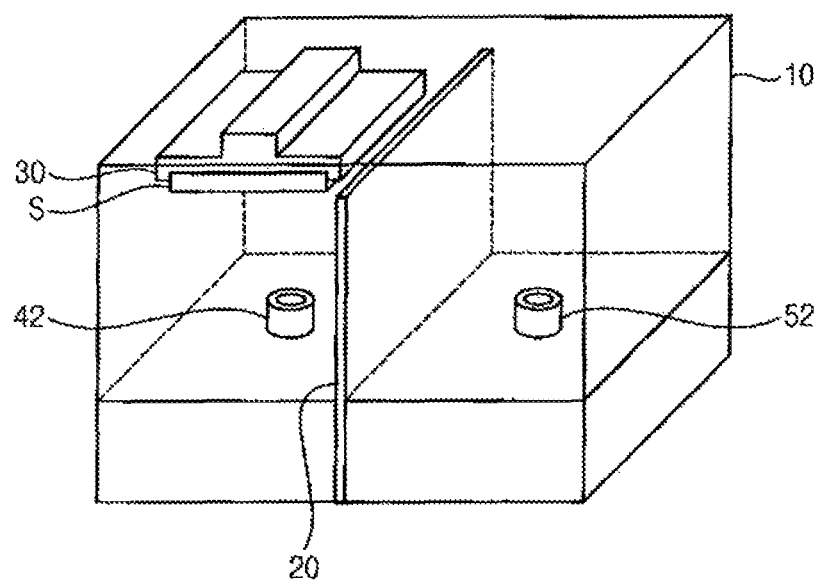
FIG. 1 is a perspective view illustrating a deposition apparatus according to an example embodiment of the present invention.

Various example embodiments will be described more fully hereinafter with reference to the accompanying drawings, in which example embodiments are shown. Example embodiments of the present inventive concept may, however, be embodied in many different forms and should not be construed as limited to example embodiments set forth herein. In the drawings, the sizes and relative sizes of layers and regions may be exaggerated for clarity. Like numerals refer to like elements throughout.

As used herein, the term "and/or" includes any and all combinations of one or more of the associated listed items.

It will be understood that when an element is referred to as being "connected" or "coupled" to another element, it can be directly connected or coupled to the other element or intervening elements may be present.

The terminology used herein is for the purpose of describing particular example embodiments only and is not intended to be limiting of example embodiments of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Figure 2:
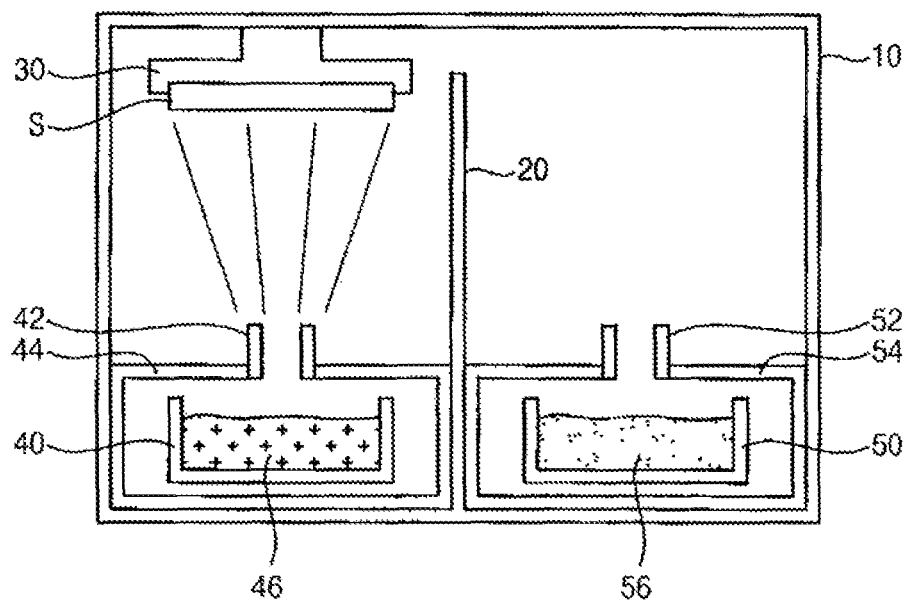
FIG. 2 is a cross-sectional view illustrating a deposition apparatus of FIG. 1.

FIG. 1 is a perspective view illustrating a deposition apparatus according to an example embodiment of the present invention and FIG. 2 is a cross-sectional view illustrating a deposition apparatus of FIG. 1.

Referring to FIGS. 1 and 2, a deposition apparatus 100 includes, for example, a vacuum chamber 10, a barrier member 20, a transporting device 30, a first deposition source 40, a second deposition source 50, a first nozzle 42, a second nozzle 52, a first heating device 44 and a second heating device 54.

The vacuum chamber 10 provides a process space in which deposition materials 46 and 56 are deposited on a substrate S. An inner space of the vacuum chamber 10 may be maintained in a vacuum state by, for example, being connected to a vacuum pump (not shown) and a door (not shown) may be arranged on the side of the vacuum chamber 10 for inserting and exporting the substrate S to and from the vacuum chamber 10.

The vacuum chamber 10 includes, for example, the transporting device 30 which may support and transport the substrate S on which the first deposition material 46 and the second deposition material 56 may be deposited. Further, the vacuum chamber 10 includes, for example, the first heating device 44 which allows the first deposition material 46 to be evaporated by heating the first deposition source 40 and the second heating device 54 which allows the second deposition material 56 to be evaporated by heating the second deposition source 50.

The transporting device 30 may be mounted on top of the vacuum chamber 10, and may support the substrate S. The bottom of the substrate S on which the first deposition material 46 and the second deposition material 56 will be deposited may be placed opposite the bottom of the vacuum chamber 10 on which the first nozzle 42 and the second nozzle 52 are disposed. Further, the transporting device 30 may include a means of movement (not shown), which transports the substrate S in a first direction in which the first nozzle 42 is disposed or in a second direction in which the second nozzle 52 is disposed. For example, the first deposition material 46 may be deposited on the substrate S when the substrate S is placed above the first nozzle 42 by transporting the substrate S in the first direction, and the second deposition material 56 may be deposited on the substrate S when the substrate S is placed above the second nozzle 52 by transporting the substrate S in the second direction.

The first heating device 44 and the second heating device 54 may be mounted to the bottom of the vacuum chamber 10. The first heating device 44 may evaporate the first deposition material 46 by heating the first deposition source 40 and the second heating device 54 may evaporate the second deposition material 56 by heating the second deposition source 50. The first heating device 44 and the second heating device 54 may include, for example, a heating line or a pipe having hot water or gases that heats the first deposition source 40 and the second deposition source 50 by using the heat generated from power supplied from an external power supply (not shown).

The first deposition source 40 and the second deposition source 50 may be disposed on the bottom of the vacuum chamber 10 opposite the substrate S. The first deposition source 40 and the second deposition source 50 may be formed, for example, in a shape of a box having an opening and allow the first deposition material 46 and the second deposition material 56 to be evaporated to the substrate S.

The first deposition material 46 and the second deposition material 56 corresponding to deposition materials which are deposited on the substrate S may be stored in the first deposition source 40 and the second deposition source 50. The first deposition source 40 and the second deposition source 50 may be formed of materials, for example, having high thermal conductivity. For example, the first deposition source 40 and the second deposition source 50 may be formed by conductive materials such as tungsten (W), aluminum (Al), Pyrolytic Boron Nitride (PBN), Graphite, tantalum (Ta), beryllium oxide (BeO) pyrolytic graphite (PG), etc. When deposition materials are organic materials, the materials of the first deposition source 40 and the second deposition source 50 may be, for example, the same as above conductive materials. When deposition materials are metal materials such as, for example, aluminum (Al), the materials of the first deposition source 40 and the second deposition source 50 may be selected considering a reactivity between the deposition material and the deposition source.

The first deposition source 40 and the second deposition source 50 are disposed in, for example, a line configuration. The first deposition source 40 and the second deposition source 50 are fixed, and the first deposition material 46 may be deposited on the substrate S when the substrate S is above the first deposition source 40 and the second deposition material 56 may be deposited on the substrate S when the substrate S is above the second deposition source 50.

In the present example embodiment, the deposition apparatus is described as having two deposition sources, but example embodiments of the inventive concept are not limited thereto. Rather, in an example embodiment, the deposition apparatus may have, for example, more than two deposition sources according to the number of the deposition materials.

The first nozzle 42 and the second nozzle 52 may be disposed on top of the first heating device 44 and the second heating device 54 which surround the first deposition source 40 and the second deposition source 50. The first nozzle 42 and the second nozzle 52 may control the deposition rate of the first deposition material 46 and the second deposition material 56 by changing a progress direction of the first deposition material 46 and the second deposition material 56 which progress to the substrate S by evaporating from the first deposition source 40 and the second deposition source 50. Thus, the uniformity of the first deposition material 46 and the second deposition material 56 may be increased using the first nozzle 42 and the second nozzle 52.

Further, the first nozzle 42 and the second nozzle 52 may include, for example, a means of rotation (not shown). For a uniform deposition, the first nozzle 42 and the second nozzle 52 may, for example, be tilted by the means of rotation and the progress direction of the first deposition material 46 and the second deposition material 56 may be changed.

The first nozzle 42 and the second nozzle 52 may include, for example, a means of heating (not shown) and the means of heating may maintain a temperature difference between the substrate S and the first deposition material 46 and the second deposition material 56 being sprayed from the first deposition source 40 and the second deposition source 50. The means of heating may increase the density of the deposition and the rate of deposition by maintaining the temperature difference high between the substrate S and the first and second deposition materials 46 and 56.

The first deposition material 46 and the second deposition material 56 may include all materials which may perform a method of thermal evaporation such as, for example, organic materials and inorganic materials. Each of the first deposition material 46 and the second deposition material 56 may include, for example, a point source or a linear source.

The barrier member 20 may be disposed between the first nozzle 42 and the second nozzle 52 to block the first deposition material 46 from being mixed with the second deposition material 56 by forming a wall.

For example, the first deposition material 46 may proceed to an entrance of the second nozzle 52 while the first deposition material 46 is deposited on the substrate S. The first deposition material 46 on the second nozzle 52 may be mixed with the second deposition material 56 when the second deposition material 56 is sprayed from the second nozzle 52 and it may interrupt the formation of high purity deposition layer. Thus, the mixing of the first deposition material 46 and the second deposition material 56 may be prevented by forming the barrier member 20.

The barrier member 20 may include, for example, a means of control (not shown). The height of the barrier member 20 may be controlled by the size and the thickness of the substrate S.

For example, when the substrate S is transported in the first direction or in the second direction, a transporting path for the substrate S may be secured by forming the barrier member 20 lower than the substrate S. While the first deposition material 46 or the second deposition material 56 is deposited on the substrate S, the mixing of the first deposition material 46 and the second deposition material 56 may be prevented by forming the barrier member 20 higher than the substrate S.

Alternatively, in an embodiment, the first deposition material 46 and the second deposition material 56 may be deposited instead using the deposition apparatus 100 in a manner as described below. For example, in an example embodiment, the barrier member 20 may be alternatively formed lower than the first nozzle 42 and the second nozzle 52. In this case the substrate S may be placed between the first nozzle 42 and the second nozzle 52, and the first nozzle 42 and the second nozzle 52 may be tilted toward the substrate S. The first deposition material 46 and the second deposition material may be sprayed to the substrate at the same time. Thus, a method of mixture deposition with the first deposition material 46 and the second deposition material 56 may be performed.

Figure 3A:
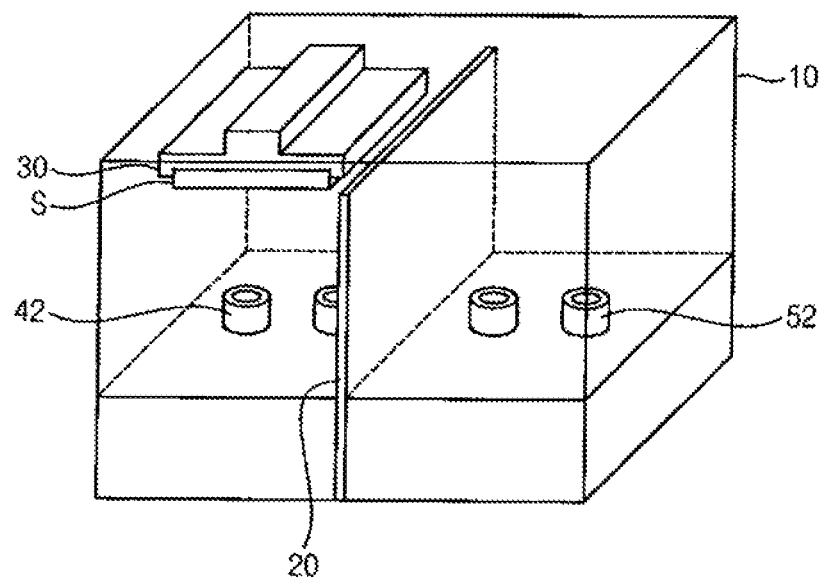
FIG. 3A is a perspective view illustrating a deposition apparatus according to an example embodiment of the present invention.
Figure 3B:
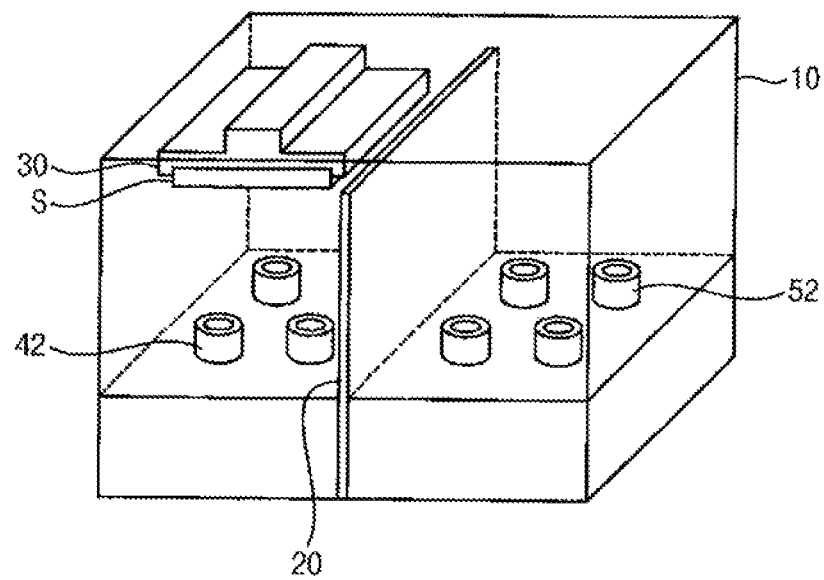
FIG. 3B is a perspective view illustrating a deposition apparatus according to an example embodiments of the present invention.

FIG. 3A is a perspective view illustrating a deposition apparatus according to an example embodiment of the present invention and FIG. 3B is a perspective view illustrating a deposition apparatus according to an example embodiment of the present invention.

Referring to FIGS. 3A and 3B, the deposition apparatus may include at least one of the first nozzle 42 and at least one of the second nozzle 52. For example, according to FIGS. 1 and 2, only one first nozzle 42 and only one second nozzle 52 are disposed above the first deposition source 40 and the second deposition source 50, respectively. But, the number of each of the first nozzle 42 or the second nozzle 52 may be one or a plurality according to the size and the kind of the substrate S and the kind and properties of the deposition materials.

Referring to FIG. 3A, a plurality of the first nozzles 42 and the second nozzles 52 may be disposed in, for example, a same line as each other. Referring to FIG. 3B, a plurality of the first nozzles 42 and a plurality of the second nozzles 52 may be disposed in, for example, a matrix configuration. The first and second nozzles 42 and 52 may be disposed with, for example, a regular distance therebetween to deposit a deposition material on the substrate S uniformly.

Figure 4:
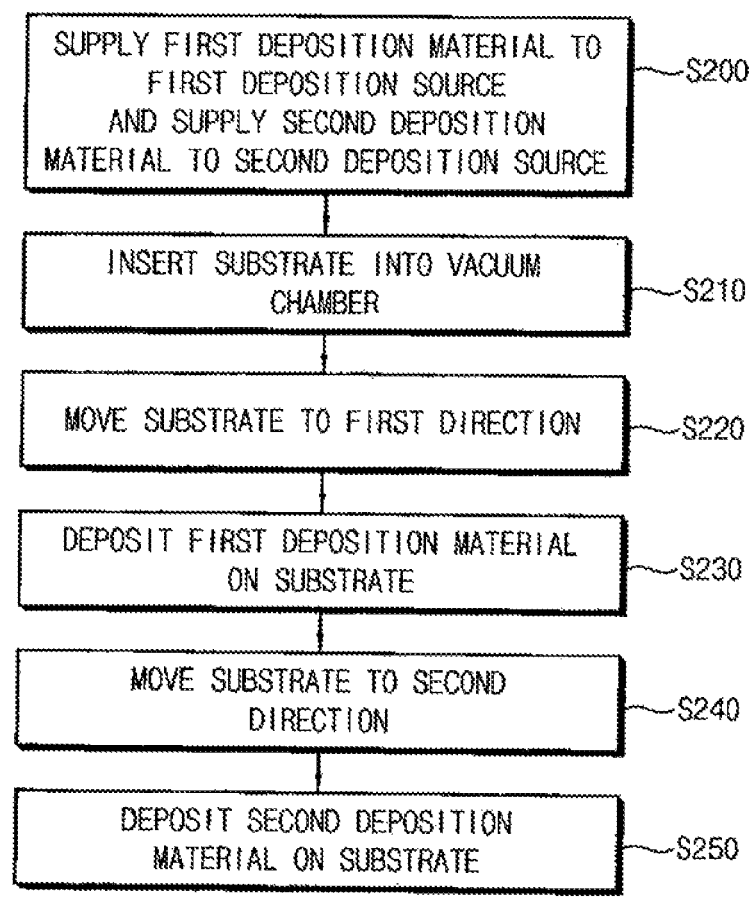
FIG. 4 is a flowchart illustrating a method for deposition of FIG. 1.

FIG. 4 is a flowchart illustrating a method for deposition of FIG. 1 and FIGS. 5A and 5B are cross-sectional views illustrating a method for deposition of FIG. 4.

Referring to FIG. 4, a first deposition material is supplied to a first deposition source and a second deposition material is supplied to a second deposition source (step S200).

The first deposition material and the second deposition material are, for example, different kinds of materials from each other, and a first heating device and a second heating device may apply, for example, different temperatures from each other to evaporate the first deposition material and the second deposition material, respectively.

The first deposition material and the second deposition material may include all materials which may be performed by a method of thermal evaporation such as, for example, organic materials and inorganic materials. Each of the first deposition material and the second deposition material may include, for example, a point source or a linear source.

A substrate may be inserted into a vacuum chamber and placed on a transporting device opposite a first nozzle and a second nozzle (step S210).

As described above, the substrate may be placed on the transporting device by, for example, inserting the substrate into the vacuum chamber through a door for inserting and exporting the substrate.

The substrate may be placed above the first nozzle by being transported in a first direction in which the first nozzle is disposed (step S220).

The substrate may be transported by the transporting device which supports the substrate. A barrier member may be formed, for example, lower than the substrate to secure a transporting path for the substrate.

The first deposition material stored in the first source is deposited on the substrate through the first nozzle (step S230).

Referring to FIG. 5A, after placing the substrate S above the first nozzle 42, the barrier member 20 is formed, for example, higher than the substrate S to prevent the first deposition material 46 from proceeding to the direction of the second nozzle 52. In addition, the first deposition material 46 stored in the first deposition source 40 may be evaporated and may be deposited on the substrate S by, for example, heating the first deposition source 40.

The substrate may be placed, for example, above the second nozzle by being transported in a second direction in which the second nozzle is disposed (step S240).

The barrier member may be formed, for example, lower than the substrate to secure a transporting path for the substrate on which the first deposition material is deposited.

The second deposition material stored in the second source is deposited on the substrate through the second nozzle (step S250).

Referring to FIG. 5B, after placing the substrate S on which the first deposition material 46 is deposited above the second nozzle 52, the barrier member 20 is formed, for example, higher than the substrate S to prevent the second deposition material 56 from proceeding to the direction of the first nozzle 42. The second deposition material 56 stored in the second deposition source 50 may be evaporated and may be deposited on the first deposition material 46 by, for example, heating the second deposition source 50.

Through the above process, the first deposition material and the second deposition material may be deposited alternately. This alternate deposition may be performed one time, or may be performed one more time to form a multi-layer structure.

FIGS. 6A to 6E are cross-sectional views illustrating a method for forming a quantum dot layer using the deposition apparatus of FIG. 1.

For example, to form a quantum dot layer using the deposition apparatus described above, a first deposition material stored in a first deposition source may be an organic material and a second deposition material stored in a second deposition source may be an inorganic material.

For example, the first deposition material which is an organic material may be selected from a II-VI compound semiconductor such as cadmium selenide (CdSe), cadmium sulfide (CdS), cadmium telluride (CdTe), zinc selenide (ZnSe), zinc telluride (ZnTe), zinc sulfide (ZnS), mercury telluride (HgTe), mercury sulfide (HgS), mercury selenide (HgSe), mercury selenide sulfide (HgSeS), mercury selenide telluride (HgSeTe), mercury sulfide telluride (HgSTe), mercury zinc sulfide (HgZnS), mercury zinc selenide (HgZnSe), mercury zinc telluride (HgZnTe), mercury zinc selenide sulfide (HgZnSeS), mercury zinc selenide telluride (HgZnSeTe), mercury zinc selenide telluride (HgZnSTe), cadmium selenide sulfide (CdSeS), cadmium selenide telluride (CdSeTe), cadmium sulfide telluride (CdSTe), cadmium zinc sulfide (CdZnS), cadmium zinc selenide (CdZnSe), cadmium zinc telluride (CdZnTe), cadmium mercury sulfide (CdHgS), cadmium mercury selenide (CdHgSe), cadmium mercury telluride (CdHgTe), cadmium zinc selenide sulfide (CdZnSeS), cadmium zinc selenide telluride (CdZnSeTe), cadmium zinc selenide telluride (CdZnSTe), cadmium mercury selenide sulfide (CdHgSeS), cadmium mercury selenide telluride (CdHgSeTe), cadmium mercury sulfide telluride (CdHgSTe), zinc selenide sulfide (ZnSeS), zinc selenide telluride (ZnSeTe), zinc sulfide telluride (ZnSTe), etc. or a III-V compound semiconductor such as indium arsenide (InAs), indium phosphide (InP), gallium nitride (GaN), gallium phosphide (GaP), gallium arsenide (GaAs), aluminum nitride (AlN), aluminum phosphide (Alp), aluminum arsenide (AlAs), indium nitride (InN), gallium nitrogen phosphide (GaNP), gallium nitrogen arsenide (GaNAs), gallium arsenide phosphide (GaAsP), aluminum arsenide phosphide (AlNP), aluminum arsenide nitride (AlAsN), aluminum arsenic phosphide (AlAsP), etc.

Further, the second deposition material which is an inorganic material may be selected from a material such as, for example, platinum (Pt), magnesium (Mg), molybdenum oxide ($MoO_3$), tungsten oxide ($WO_3$), cesium oxide ($Cs_2O$), nickel oxide (NiO), copper oxide (CuO), titanium oxide ($TiO_2$), silicon oxide ($SiO_2$), silicon oxynitride (SiOxNy), vanadium oxide ($V_2O_5$), etc.

Each of the first deposition material and the second deposition material may be, for example a linear source or a point source.

Figure 6A:
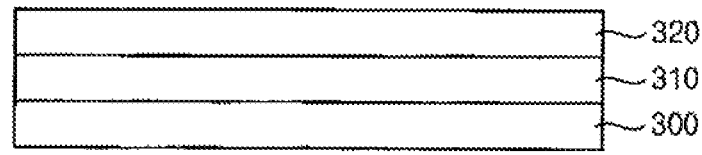
FIGS. 6A to 6E are cross-sectional views illustrating a method for forming a quantum dot layer using the apparatus for deposition of FIG. 1.

Referring to FIG. 6A, a first electrode 310 and hole injection layer 320 are substantially stacked on a first substrate 300. In an example embodiment of the inventive concept, a method of forming a light emitting layer having quantum dot layers on the first substrate 300 on which the first electrode 310 and the hole injection layer 320 are stacked is provided. Alternatively, in an example embodiment, a light emitting layer may be formed, for example, on a second substrate on which a second electrode and an electron transport layer are stacked. The first substrate 300 may be formed of, for example, transparent glass, quartz, plastic, or the like. Also, in an exemplary embodiment, the first substrate 300, may be formed of, for example, ceramic or silicon materials. Further, in an exemplary embodiment, the first substrate 300 may be, for example, a flexible substrate. Suitable materials for the flexible substrate include, for example, polyethersulfone (PES), polyethylenenaphthalate (PEN), polyethylene (PE), polyimide (PI), polyvinyl chloride (PVC), polyethylene terephthalate (PET), or combinations thereof.

The first electrode 310 may be formed as a transparent electrode or a reflective electrode. A transparent electrode may be formed of, for example, indium tin oxide (ITO), indium zinc oxide (IZO), zinc oxide (ZnO), or indium oxide ($In_2O_3$). A reflective electrode may be formed by forming a reflective layer from, for example, silver (Ag), magnesium (Mg), aluminum (Al), platinum (Pt), palladium (Pd), gold (Au), nickel (Ni), neodymium (Nd), iridium (Ir), chromium (Cr) or a compound thereof and forming a layer of ITO, IZO, ZnO, or $In_2O_3$ on the reflective layer.

Further, auxiliary layers may, for example, be inserted between the hole injection layer and the light emitting layer to increase the efficiency of electron-hole injection.

Figure 6B:
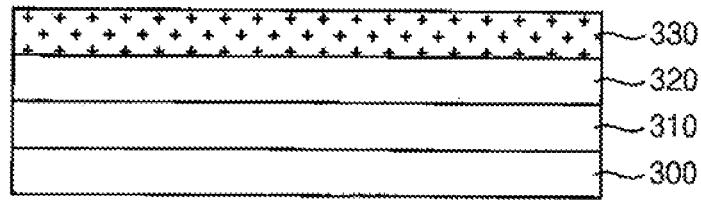

Referring to FIG. 6B, on the top of the first substrate 300 on which the first electrode 310 and the hole injection layer 320 are stacked, the first deposition material (organic material) may be stacked on the hole injection layer 320. After loading the first substrate 300 and transporting the first substrate 300 in a first direction, the first deposition material (organic material) may be deposited on the hole injection layer 320 by, for example, heating a first deposition source using the deposition apparatus described above. At this time, an organic layer deposited on the hole injection layer 320 may be called a first organic layer 330.

Figure 6C:
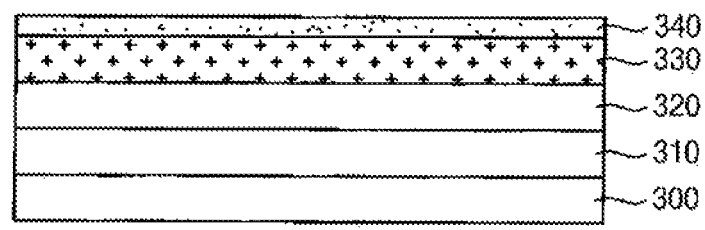

Referring to FIG. 6C, on the top of the first substrate 300 on which the first organic layer 330 is stacked, the second deposition material (inorganic material) may be stacked on the first organic layer 330. After transporting the first substrate 300 in a second direction, the second deposition material (inorganic material) may be deposited on the first organic layer by, for example, heating a second deposition source using the deposition apparatus described above. At this time, an inorganic layer deposited on the first organic layer 330 may be called an inorganic layer 340 and the inorganic layer 340 may be deposited at, for example, a thinner thickness than the first organic layer 330.

Figure 6D:
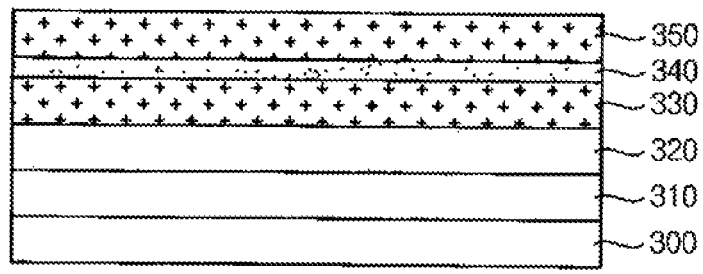

Referring to FIG. 6D, on the top of the first substrate 300 on which the inorganic layer 340 is stacked, the first deposition material (organic material) may again be stacked on the inorganic layer 340. After transporting the first substrate 300 in the first direction, the first deposition material (organic material) may be deposited on the inorganic layer 340 by, for example, heating the first deposition source using the deposition apparatus described above. At this time, the organic layer may be called a second organic layer 350. The second organic layer 350 may be deposited at, for example, the same thickness as the first organic layer 330 and at, for example, a thicker thickness than the inorganic layer 340.

The inorganic layer 340 may be, for example, isolated between the first organic layer 330 and the second organic layer 350.

Figure 6E:
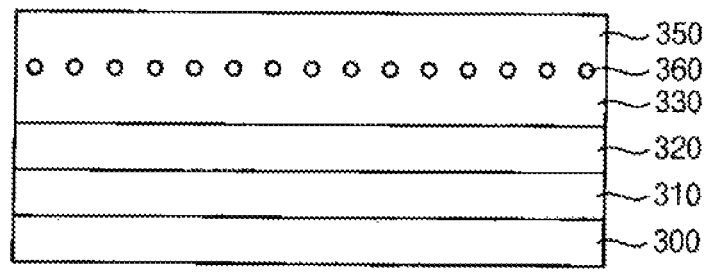

Referring to FIG. 6E, the inorganic layer 340 stacked between the first organic layer 330 and the second organic layer 350 may form a quantum dot 360. A surface energy level of inorganic materials of the inorganic layer 340 is, for example, higher than a surface energy level of organic materials of the first and second organic layers 330 and 350, and thus the inorganic materials may not mix with the organic materials and the inorganic materials are agglomerated. The inorganic layer 340 stacked between the first organic layer 330 and the second organic layer 350 forms, for example, ball-shaped quantum dots 360 by the difference between the surface energy level of the first and the second organic layers 330, 350 and the surface energy level of the inorganic layer 340. At this time, a plurality of quantum dots 360 having a size which emits light of, for example, the same wavelength band as each other may form a quantum dot layer between the first and second organic layers 330 and 350.

When a size of the quantum dot 360 is decreased, the light generated from the quantum dot 360 of the small size has short emission wavelength. When a size of the quantum dot 360 is increased, a light generated from the quantum dot 360 having the big size has a long emission wavelength. Thus, visible ray having a desired emission wavelength may be presented by controlling size of the quantum dot 360. In addition, various colors may be presented by the diverse size of the quantum dot 360 and the diverse kind of the quantum dot 360. At this time, the size of the quantum dot 360 depends on the difference of surface energy level between organic materials and inorganic materials and depends on the thickness of the inorganic materials.

Figure 7:
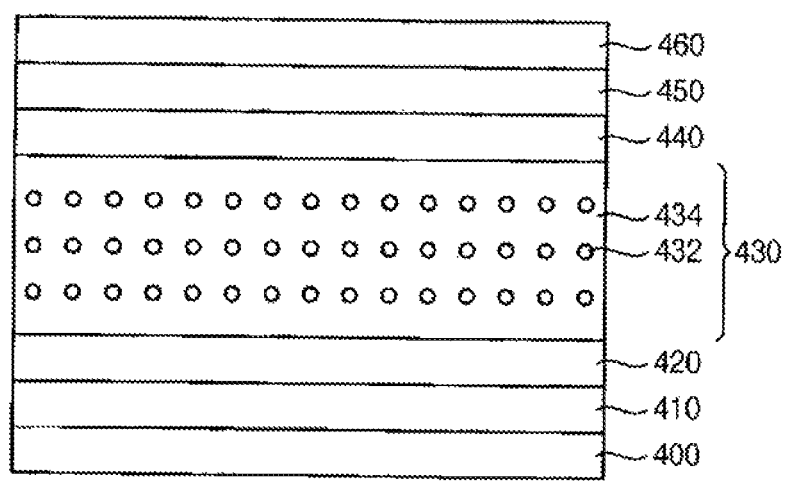
FIG. 7 is a cross-sectional view illustrating a quantum dot display including quantum dot layers manufactured by using the method for forming a quantum dot layer of FIGS. 6A to 6E.

FIG. 7 is a cross-sectional view illustrating a quantum dot display including quantum dot layers manufactured by using the method for forming a quantum dot layer of FIGS. 6A to 6E.

Referring to FIG. 7, a quantum dot display may include, for example, a first substrate 400, a first electrode 410, a hole injection layer 420, a light emitting layer 430, an electron transport layer 440, a second electrode 450 and a second substrate 460. The light emitting layer 430 may include, for example, multi-layered quantum dot layers including a plurality of quantum dots 432 between organic materials 434. In an embodiment, the first substrate 400 and the second substrate 460 may each be formed of, for example, transparent glass, quartz, plastic, or the like. Also, in an exemplary embodiment, the first substrate 400 and the second substrate 460, may each be formed of, for example, ceramic or silicon materials. Further, in an exemplary embodiment, the first substrate 400 and the second substrate 460 may each be, for example, a flexible substrate. Suitable materials for the flexible substrate include, for example, polyethersulfone (PES), polyethylenenaphthalate (PEN), polyethylene (PE), polyimide (PI), polyvinyl chloride (PVC), polyethylene terephthalate (PET), or combinations thereof.

In an embodiment, the first electrode 410 may function, for example, as an anode, and the second electrode 450 may function, for example, as a cathode. Alternatively, in an embodiment, the first electrode 410 may function, for example, as a cathode, and the second electrode 450 may function, for example, as an anode.

The first electrode 410 may be formed as a transparent electrode or a reflective electrode. A transparent electrode may be formed of, for example, indium tin oxide (ITO), indium zinc oxide (IZO), zinc oxide (ZnO), or indium oxide ($In_2O_3$). A reflective electrode may be formed by forming a reflective layer from, for example, silver (Ag), magnesium (Mg), aluminum (Al), platinum (Pt), palladium (Pd), gold (Au), nickel (Ni), neodymium (Nd), iridium (Ir), chromium (Cr) or a compound thereof and forming a layer of ITO, IZO, ZnO, or $In_2O_3$ on the reflective layer.

The second electrode 450 may be formed as, for example, a transparent electrode or a reflective electrode. When the second electrode 450 is formed as a transparent electrode, the second electrode 450 functions as, for example, a cathode. A transparent electrode may be formed by depositing a metal having a low work function, such as, for example, lithium (Li), calcium (Ca), lithium fluoride/calcium (LiF/Ca), lithium fluoride/aluminum (LiF/Al), aluminum (Al), silver (Ag), magnesium (Mg), or a compound thereof and forming a layer thereon from ITO, IZO, ZnO, $In_2O_3$, or the like. When the second electrode 450 is formed as a reflective electrode, the reflective layer may be formed of, for example, Li, Ca, LiF/Ca, LiF/Al, Al, Ag, Mg, or a compound thereof.

As shown FIGS. 6B to 6E, the plurality of quantum dot layers may be stacked above and below by, for example, repeating the process that forms inorganic materials thinly between organic materials. The auxiliary layer may be inserted between the hole injection layer and the light emitting layer and may be inserted between the light emitting layer and the electron transport layer to increase the efficiency of electron-hole injection.

Having described example embodiments of the inventive concept, it is further noted that it is readily apparent to those of ordinary skill in the art that various modifications may be made without departing from the spirit and scope of the invention which is defined by the metes and bounds of the appended claims.

What is claimed is:

1. A method for forming a quantum dot layer, the method comprising:
   depositing a first deposition material on a substrate;
   depositing a second deposition material on the deposited first deposition material at a thinner thickness than a thickness of the deposited first deposition material;
   depositing the first deposition material on the second deposition material at a same thickness as the thickness of the deposited first deposition material to isolate the second deposition material from outside; and
   agglomerating the second deposition material which is disposed between the two deposited first deposition materials to form a quantum dot layer.

2. The method of claim 1, wherein a first electrode and the hole injection layer are sequentially stacked on the substrate.

3. The method of claim 1, wherein a second electrode and the electron transport layer are sequentially stacked on the substrate.

4. The method of claim 1, wherein the first deposition material comprises an organic material and the second deposition material comprises an inorganic material.

5. The method of claim 1, wherein the second deposition material is deposited between the first deposition materials.

6. The method of claim 1, wherein the first deposition material and the second deposition material are deposited using a method of thermal evaporation.

7. The method of claim 1, wherein the quantum dot layer comprises a plurality of quantum dots each having a size configured to emit light of a same wavelength band as each other.

8. The method of claim 1, wherein the quantum dot layer has a multi-layered structure in which the quantum dot layers are vertically stacked.

9. A method for forming a display device, comprising:
forming a first electrode on a first substrate;
forming a hole injection layer on the first electrode;
forming a light emitting layer having a multi-layer quantum dot structure including a plurality of quantum dots disposed between organic materials on the hole injection layer,
wherein the forming of the light emitting layer comprises:
depositing a first deposition material on the hole injection layer to form a first organic layer on the hole injection layer by thermal evaporation,
depositing a second deposition material on the first organic layer to form an inorganic layer on the first organic layer having a thinner thickness than a thickness of the first organic layer by thermal evaporation,
depositing the first deposition material on the inorganic layer to form a second organic layer on the inorganic layer having a same thickness as the thickness of the first organic layer by thermal evaporation, and
agglomerating materials of the inorganic layer which is disposed between the first and second organic layers to form a quantum dot layer between the first and second organic layers; and
providing a stacked structure including an electron transport layer, a second electrode and a second substrate sequentially stacked on the light emitting layer.

10. The method of claim 9, wherein the forming of the light emitting layer further comprises repeating the disposing of the first and second deposition materials to form additional organic layers with additional quantum dot layers disposed therebetween such that the light emitting layer includes a multi-layer quantum dot structure including a plurality of quantum dots disposed between the first and second organic layers and the additional organic layers.

11. The method of claim 9, wherein the first deposition material is a material selected from the group consisting of as cadmium selenide (CdSe), cadmium sulfide (CdS), cadmium telluride (CdTe), zinc selenide (ZnSe), zinc telluride (ZnTe), zinc sulfide (ZnS), mercury telluride (HgTe), indium arsenide (InAs), and indium phosphide (InP), and wherein the second deposition material is a material selected from the group consisting of platinum (Pt), magnesium (Mg), molybdenum oxide ($MoO_3$), tungsten oxide ($WO_3$), cesium oxide ($Cs_2O$), nickel oxide (NiO), copper oxide (CuO), titanium oxide ($TiO_2$), silicon oxide ($SiO_2$), and silicon oxynitride (SiOxNy), and vanadium oxide ($V_2O_5$).

* * * * *